United States Patent [19]

Rast, Jr. et al.

[11] 4,002,971
[45] Jan. 11, 1977

[54] WIDE OPERATING FREQUENCY RANGE TRANSMISSION LINE DISCRIMINATOR

[75] Inventors: Gustaf J. Rast, Jr.; Thomas A. Barley, both of Huntsville, Ala.; James R. Ashley, Colorado Springs, Colo.

[73] Assignee: The United States of America as represented by the Secretary of the Army, Washington, D.C.

[22] Filed: Jan. 26, 1976

[21] Appl. No.: 652,446

[52] U.S. Cl. .............................................. 324/57 N
[51] Int. Cl.² ........................................ G01R 27/00
[58] Field of Search .................... 324/57 N, 57 R; 328/166, 165; 325/67, 363; 178/DIG. 12

[56] References Cited
UNITED STATES PATENTS

| | | | |
|---|---|---|---|
| 3,675,124 | 7/1972 | Ashley et al. | 324/57 N |
| 3,693,076 | 9/1972 | Nugent et al. | 324/57 N |

*Primary Examiner*—Stanley T. Krawczewicz
*Attorney, Agent, or Firm*—Nathan Edelberg; Robert P. Gibson; Freddie M. Bush

[57] ABSTRACT

A wide operating frequency range transmission line discriminator uses an optimum length transmission line which permits near carrier frequency modulation to be measured on a carrier frequency in a broad range from approximately two megahertz to one gigahertz. A hybrid junction, balanced phase detector, power dividers, attenuators and a variable transmission line coupled with the optimum length transmission line provide a wide frequency range discriminator with only a minimum exchange in selected components being necessary for changes in carrier frequency. This near carrier analyzer operates over the wide frequency range with the only component changes being an input bandpass filter, the optimum length transmission line, and the variable length transmission line used as a variable or adjustable phase shift device. The transmission line sections are easily changed by simply selecting proper line lengths which may be previously established. When optimum detection is not essential in a particular measurement, the optimum length transmission line can effectively operate and accomplish its function over several octaves of frequency range with minimal analyzer degradation, on the order of three decibels. In measuring frequency modulation noise, carrier nulling in excess of 60 decibels is accomplished. After this carrier null has been accomplished, the discriminator circuit rejects incidental amplitude modulation on the test signal, and is not restricted by burnout power ratings of crystals within the phase detector.

9 Claims, 7 Drawing Figures

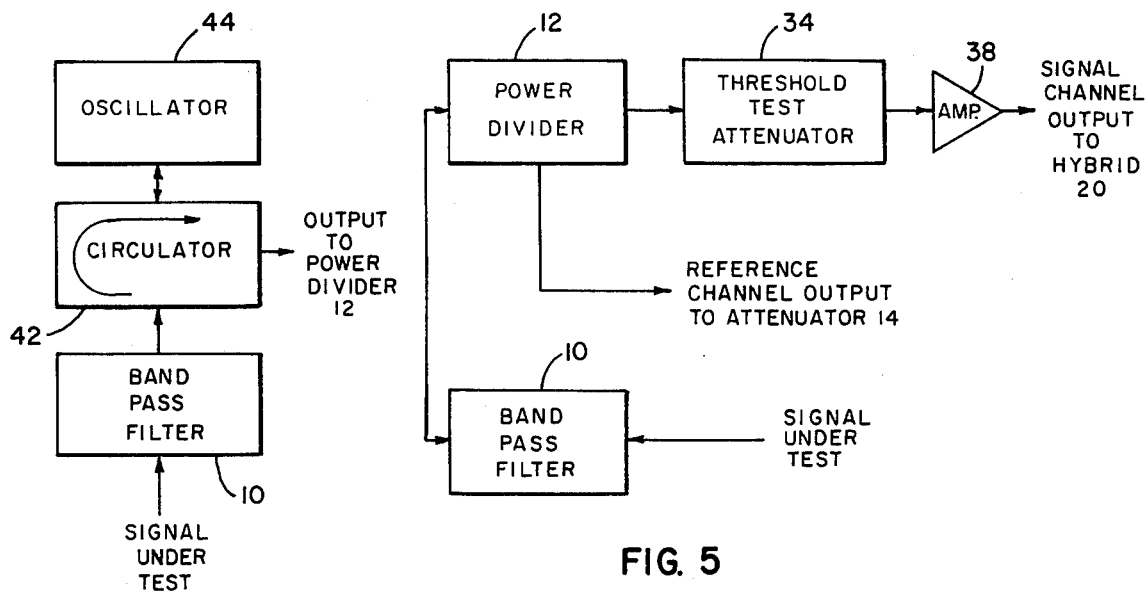
FIG. 4
FIG. 5
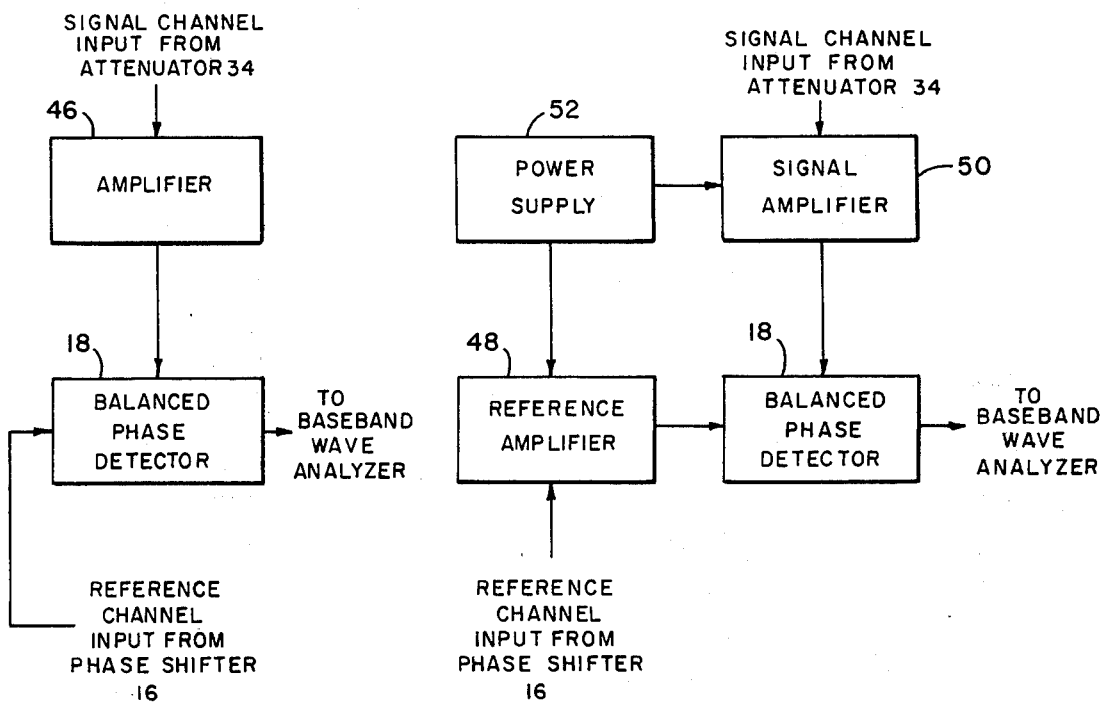
FIG. 6
FIG. 7

WIDE OPERATING FREQUENCY RANGE TRANSMISSION LINE DISCRIMINATOR

DEDICATORY CLAUSE

The invention described herein may be manufactured, used, and licensed by or for the Government for governmental purposes without the payment to us of any royalties thereon.

BACKGROUND OF THE INVENTION

The use of frequency discrimination to measure near carrier frequency modulation noise of a microwave signal is discussed by Ashley et al. in the IEEE Transactions on Microwave Theory and Techniques, Volume MTT-16, No. 9, September 1968, pages 753–760. Prior art discrimination at microwave frequencies, as described in this paper, depended on a microwave cavity as a resonant circuit. Prior art discrimination at very high frequencies (VHF) utilize such components as slope detectors and ratio detectors, depending on the lumped circuit elements of inductance and capacitance, to form resonant circuits. At ultrahigh frequencies (UHF) between the VHF and microwave region, there is little prior art on such discrimination means. Most measurements in this area are made by heterodyning the UHF signal with a local oscillator to obtain a VHF signal which is analyzed with a discriminator at the VHF frequency range. Accounting for frequency modulation (FM) noise of the local oscillator is a well established problem in these areas. Both the cavity method and the lumped circuit element method obtains a rejection of residual amplitude modulation (AM) noise on the signal under test; for example, the VHF discriminator usually employs a limiter or ratio detector. The microwave cavity discriminator rejects AM noise and also allows the input signal level to be increased, and provides the greatest discriminated output to improve the signal-to-threshold ratio, with the threshold being the lowest value of noise established or obtained within the analyzer system.

Among the discriminators discussed in prior art literature which might be useful in obtaining FM noise measurements at UHF or lower microwave frequencies is the transmission line discriminator as has been noted by R. A. Campbell in "Stability Measurement Techniques in the Frequency Domain", IEEE-NASA Symposium on Short Term Frequency Stability, NASA SP-80, November 23–24, 1964, pages 231–235. Various aspects of detection equipment and calibration are disclosed. Also, in the IEEE Transactions on Microwave Theory and Techniques, Volume MTT-23, No. 9, September 1975, pages 776–778, an article entitled "Single Hybrid Tee Frequency Discriminator" by J. Nigrin et al. discloses a discriminator tuned by a movable short and has properties comparable to those of a phase discriminator. Additional prior art includes U.S. Pat. No. 3,675,124 entitled "Apparatus for Measuring Frequency Modulation Noise Signals and for Calibrating Same" by J. R. Ashley et al. This apparatus employs an auxiliary injection phase-locked oscillator driven by a test oscillator and relies on a discriminator cavity resonator which must be accurately tuned to the exact operating frequency for acceptable operation. Ashley et al. discusses in column 6 the difficulty of making signal measurements where limited power outputs make prior art methods ineffective.

SUMMARY OF THE INVENTION

The wide operating frequency range transmission line discriminator relates to measurement of near carrier frequency modulation on a carrier frequency in a broad frequency range. Measurement is enhanced by the use of an optimum length transmission line and a variable length transmission line within the discrimination system. Because of characteristics of the optimum line, broadband measurements can be accomplished with a single transmission line or with a family of transmission lines so that the characteristic curves overlap, since the line operates effectively over several octaves of frequency range with minimum analyzer degradation.

The transmission line discriminator is used in the high, very high, and ultrahigh frequency regions for making measurements of near carrier frequency modulation (FM) noise. Use of coaxial components allows one set of measuring components to work from two megahertz to one gigahertz with only a few changes of transmission line length to cover the extremely broadband range. In conjunction with the broadband operation, the signal-to-threshold is improved, the system measurement threshold is readily determined, incidental amplitude modulation (AM) on the signal under test is rejected, and the measured FM noise can be corrected for the established measurement threshold.

BRIEF DESCRIPTION OF THE DRAWINGS

FIGS. 3–7 are alternative embodiments of the wide operating frequency range transmission line discriminator of FIG. 1.

DESCRIPTION OF THE PREFERRED EMBODIMENT

Figure 1:
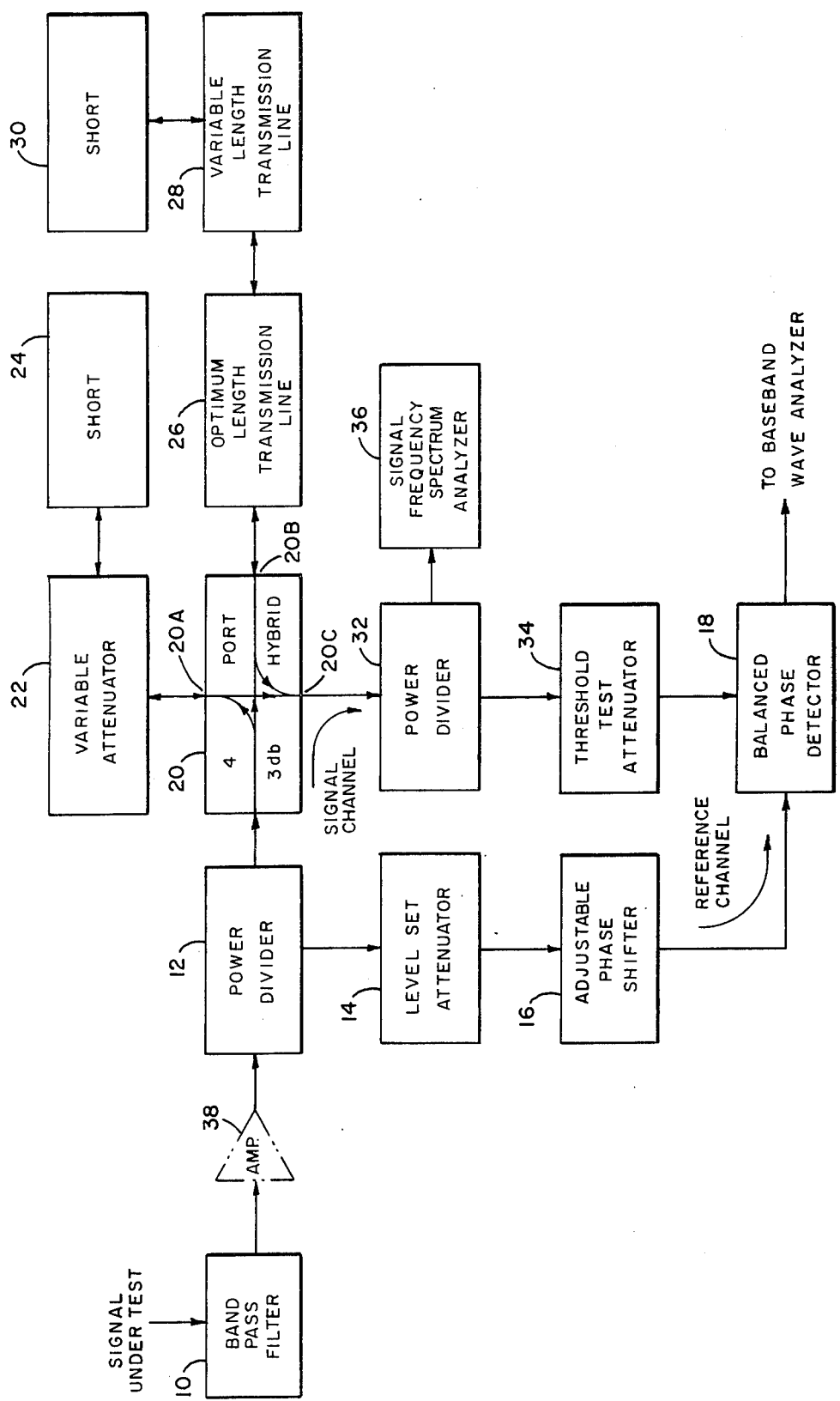
FIG. 1 is a block diagram of a preferred embodiment of the wide operating frequency range transmission line discriminator.

Referring now to the drawing wherein like numbers represent like parts in each of the several figures, a signal whose near carrier sidebands (frequency modulated) are to be measured is applied directly into the transmission line discriminator bandpass filter 10 as shown in FIG. 1. Bandpass filter 10 is required because of the inherent wide band nature of the discriminator. The discriminator covers approximately three decades (1,000 to 1) of frequency range. This provides a measurement capability in one apparatus that has previously been non-existant.

A signal whose near carrier sidebands are to be measured is coupled into bandpass filter 10 for excluding other possible signals, and is coupled from filter 10 into power divider 12. Power divider 12 can be any one of several different elements such as a directional coupler or a 3-db power splitter. The basic function performed by the power divider is to divide the incoming signal into two appropriate paths — the signal channel and the reference channel.

The signal flow path through the reference channel comes from an output of power divider 12 into a level set attenuator 14 which provides a means for adjusting the power level in the remainder of the reference channel. The adjusted signal power level output from attenuator 14 is then coupled into phase shifter 16 to allow adjustment of the phase angle between the signal channel and reference channel during calibration of the discriminator. This is necessary because quadrature detection requires two signals in quadrature to allow frequency or phase modulation detection. The output of adjustable phase shifter 16 is then applied to a balanced phase detector 18.

The signal channel is formed from the other output signal coupled from power divider 12. The signal channel power is applied to a hybrid 20 whose main purpose is to provide signal power routing to allow carrier cancellation on the signal channel carrier. Hybrid 20 couples the signal channel power into three paths. One path the signal channel takes from hybrid 20 is from port 20A of hybrid 20 through an attenuator 22 to a transmission line short circuit 24. The short circuit reflects the signal back into port 20A to provide a reflected signal at hybrid 20 which can be adjusted in amplitude. There is a phase reversal of the signal at short 24 because of the reflection, however, the only other phase shift occuring in this path is the result of phase shifting occuring as the attenuator is adjusted. This incidental phase shifting as attenuator levels are changed is inherent in such systems. The second signal channel path from hybrid 20 is from port 20B through the optimal length transmission line 26 and through a variable length transmission line 28 to a transmission line short 30. The signal is reflected at short 30 and returned to hybrid 20. The optimum length transmission line 28 allows wideband tuning because the exact length of line is not a critical factor. Since the exact length of optimum line 26 is not critical, the small section of variable length transmission line 28 provides a phase shifting adjustment function for phase cancellation when the signal in this path returns to hybrid 20 and is combined with the signal entering port 20A. Combining the signals reflected back to hybrid 20 with the capability for attenuation adjustment in one path and phase shifting in the other path allows effective cancellation of unwanted signal energy to be accomplished on the signal channel carrier. Cancellation of a signal carrier is accomplished by adjusting variable attenuator 22 to match the attenuation in the optimum length transmission line 26 path, then balancing the phase by adjusting the length of line inserted by variable length transmission line 28. During calibration this adjustment may require several trial settings of each adjustable element to attain optimum adjustment. A third path 20C from hybrid 20 allows the nulled signal resulting from the combination of signals entering ports 20A and 20B to be applied through a power divider 32 and threshold test attenuator 34 to balanced phase detector 18. The signal output from power divider 32 is also coupled to a spectrum analyzer 36. Spectrum analyzer 36 samples the signal from power divider 32 and provides the capability to observe the nulling process, allowing a proper null to be established. Spectrum analyzer 36 also provides the capability for checking sideband level accuracy on the calibration carrier. There are several established ways of obtaining a calibration signal with proper sideband levels.

The signal coupled through attenuator 34 to balanced phase detector 18 is actually the signal utilized in measurement of carrier sideband noise. During a sideband noise measurement, attenuator 34 is set for minimum attenuation. However, during the process of determining the basic system noise within the mensuration equipment, attenuator 34 allows sufficient attenuation to be inserted to ensure that the incoming signal is attenuated below system noise levels. This process is commonly referred to as threshold measurement.

Balanced phase detector 18 operates as a quadrature phase detector. This is accomplished by using adjustable phase shifter 16 to align the reference channel signal in quadrature with the signal channel signal. The resulting output signal from phase detector 18 is then a frequency discriminated and translated set of sidebands that have been moved from the carrier frequency region to selected baseband frequencies for further analysis. The output from the phase detector is then analyzed using the necessary amplification, bandpass filtering and recording devices in a wave analyzer circuit (not shown) to extract baseband data. Normal baseband circuitry may comprise a low noise amplifier, a video-spectrum analyzer with selectable bandwidths and an $x$–$y$ plotter.

Figure 2:
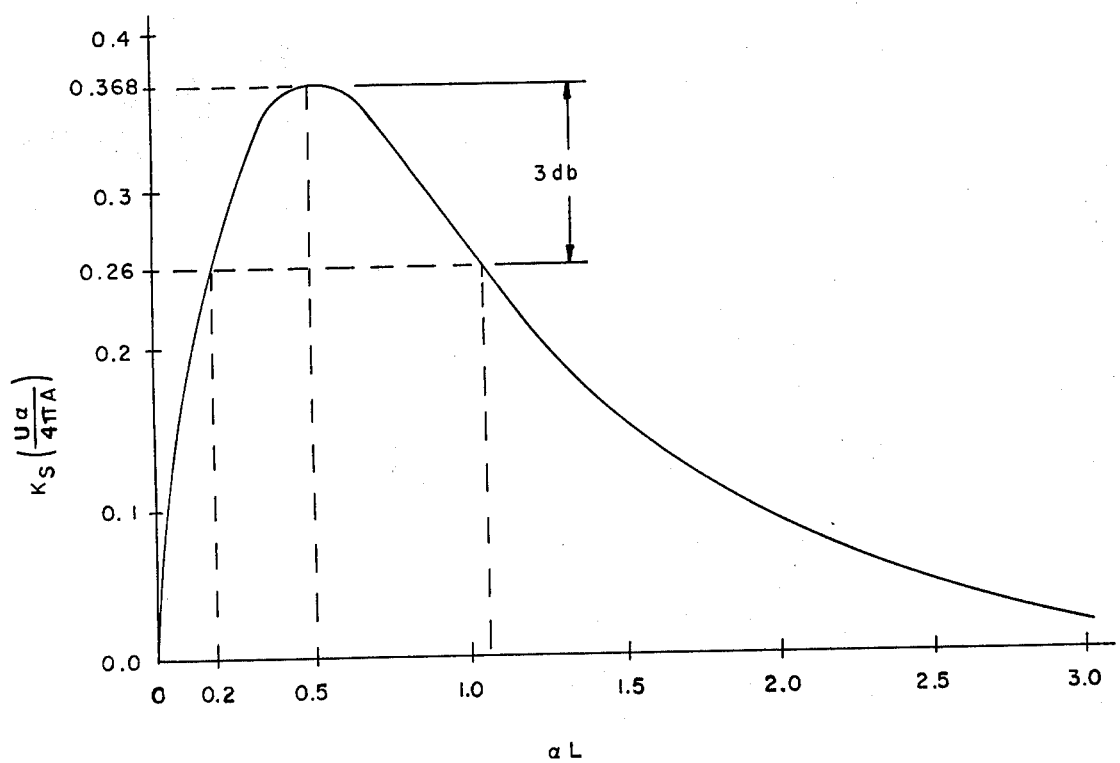
FIG. 2 is a graph of the discriminator normalized sensitivity versus transmission line length.

The relative sensitivity curve of the transmission line discriminator is shown normalized in FIG. 2. The optimum length of the line occurs when $\alpha L = 0.5$ and gives maximum sensitivity to the measurement apparatus. These characteristics are derived either through trigonometric or exponential derivations beginning with fundamental equations such as Helmholtz's equations. An important feature of this optimized line as noted in FIG. 2 is that the peak of the line length versus optimum output is a broad shape and not a sharp peak. Since $\alpha$ varies slowly, being approximately proportional to the square root of frequency, this particular characteristic allows near optimum operation over a considerable frequency range without appreciable degradation in the analyzer operation. Allowing a sensitivity degradation of up to 3 db permits the usable frequency range of a particular length to be more than four octaves.

The optimum length transmission line is always determined at a particular design frequency. For the design frequency the optimum length line is always the electrical length of line at which total attenuation is one neper (8.68 decibels). As shown in FIG. 2, this length occurs for the particular embodiment after the signal has traversed the line and been reflected back through the line. Because of the broad bandwidth of utilization before sensitivity deteriorates, a single optimum length line used in the discriminator allows a broad range of frequency measurements to either side of the optimum frequency before noticeable loss of sensitivity affects operation of the circuit. In FIG. 2, the transmission line length is L, attenuation per unit length of line is $\alpha$, line transmission velocity is U, A is the amplitude in volts of the signal applied to the transmission line, and $K_s = \Delta v/\Delta f$ is the discriminator sensitivity in volts ($\Delta v$) per Hertz deviation ($\Delta f$). Utilizing 3 db sensitivity degradation as the controlling factor for the optimum line length allows an operating frequency range within 0.4 to 2.1 nepers of total attenuation, corresponding to a $(2.1/0.4)^2 = 27.6$ frequency range, to be satisfactorily obtained. Obviously, several selected optimum length transmission lines, such as coaxial cables can be utilized to provide a family of optimum length lines with overlapping attenuation curves to cover a very broad range of measurement.

It is common knowledge among those skilled in the art to calibrate similar systems using known FM sideband levels. Two basic techniques used in calibration are a direct carrier nulling operation and an indirect sideband level magnitude operation. The direct technique involves FM modulaing a source with sufficient driving power to reach a condition wherein the carrier vanishes. Adding attenuation in the modulation signal source then allows a known sideband level to be established (40 db below the carrier at 18,600 Hertz is a widely used reference). This method is very useful on devices such as Klystrons which can easily be modulated by inserting the modulating source into the Klystron repeller circuit. However this method does not work well when the source is a highly stable crystal oscillator.

The indirect technique can be done in one of two ways. A substitution technique may be used or the source can be separated from the near carrier analyzer and a sideband generating circuit can be inserted between these two units to establish calibrated sidebands on the source. The carrier substituted method requires that a second source which can be easily modulated be substituted for the signal source to be measured. The carrier level of the substitute source is accurately matched in frequency and amplitude to the signal source to be measured. The substitute source then provides the sidebands at known levels to accomplish the calibration. After calibration, the signal to be measured is reconnected to the calibrated analyzer and the measurement is made using the calibration set up by the substitute source.

For the second indirect calibration technique, the modulating circuit inserted between the source to be measured and the analyzer uses a small portion of the source signal power as a base upon which sidebands are generated. These sidebands are then reinserted into the signal path and properly phase shifted to be calibrated on a spectrum analyzer as FM sidebands of the desired magnitude.

With the application of a calibration signal with known FM sidebands the operation of balanced phase detector 18 is now ready for optimization. Calibration of detector 18 involves setting adjustable phase shifter 16 for an optimum sideband power readout with the appropriate power level in the reference channel and a properly nulled signal channel input both applied simultaneously to balanced phase detector 18. Spectrum analyzer 36 is used to determine proper sideband levels on the calibration input signal. The phase detector 18 output is applied to the baseband analysis equipment (not shown) which is observed during the calibration process.

The video bandpass filter of the baseband analysis equipment (not shown) is set for the modulation offset frequency which is supplied at a known level by the calibration signal. The phase detection process is optimized by adjusting adjustable phase shifter 16 for a maximum output signal level at the output of this bandpass filter. Completion of the calibration requires that the readout device in the baseband analysis equipment be used to record the maximized output of the bandpass filter. This calibrates the entire system.

In normal operation, threshold test attenuator 34 is set for minimum attenuation. This condition applies maximum available power to balanced phase detector 18. However, during the threshold measurement operation, threshold test attenuator 34 inserts sufficient attenuation to adequately suppress the signal channel power allowing a measurement of the basic noise power within the analyzer system. This internal system noise as measured in this manner is termed "threshold noise".

A near carrier measurement is then made by applying the signal to be analyzed to bandpass filter 10. It is important that the calibration signal and the signal to be analyzed have the same carrier amplitude, otherwise the calibration will not be valid. The near carrier sideband data is measured and recorded by the baseband equipment using the desired filter bandwidths and covering the desired modulation frequency range.

Where the input signal under test does not have sufficient power to establish the power level in the reference channel as required by phase detector 18, an amplifier 38, as shown in phantom in FIG. 1, may be inserted between filter 10 and power divider 12 to extend the power input operation range. Adding amplifier 38 amounts to the addition of one amplifier with its associated power supply for extending the power input operating range.

Figure 3:
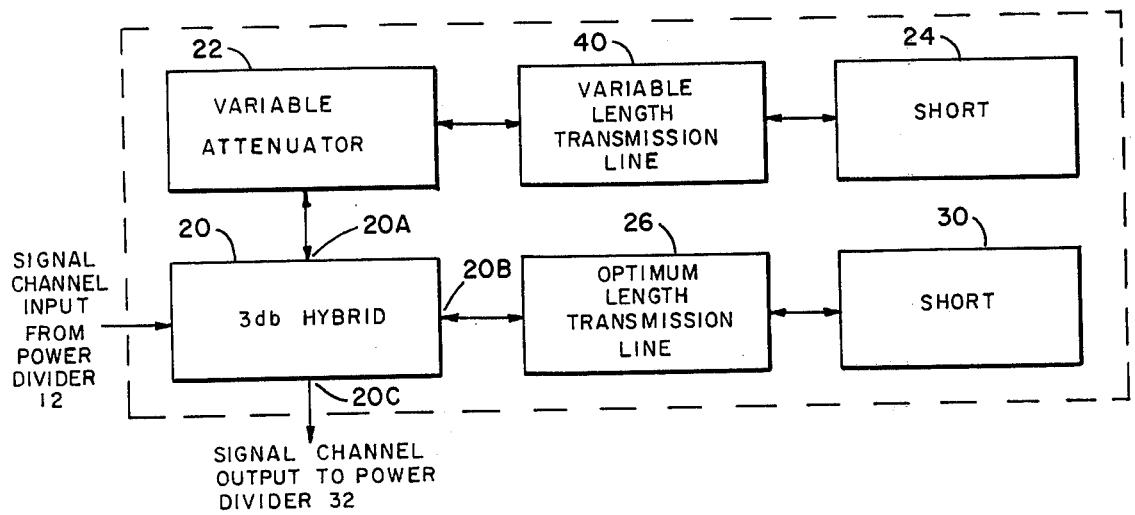

FIG. 3 discloses an alternative embodiment to that of FIG. 1 wherein the variable length line 28 of FIG. 1 is removed and a variable length line 40 is inserted between attenuator 22 and short circuit 24. The phase shifting function of the variable length transmission line is relocated in the path of hybrid port 20A by this change. This alternate embodiment is nulled in substantially the same manner as the embodiment of FIG. 1. Thus when the signals are coupled back into ports 20A and 20B to be recombined in the hybrid, effective cancellation of unwanted signal energy is accomplished.

In the alternative embodiment as shown in FIG. 4, the signal under test is coupled through filter 10 to a circulator 42. The circular is coupled to an oscillator 44 and has an output coupled to power divider 12. Circulator 42 function as a signal routing means to channel all the signal input power to oscillator 44 with negligible power coupling directly into power divider 12. The output of oscillator 44 is then coupled back through circulator 42 to divider 12 with negligible feedback to the input filter. Oscillator 44 is injection phase locked to the incoming signal to provide additional power for operating the analyzer. Its application is more limited than that of an amplifier such as amplifier 38 in FIG. 1. However, within the injection locking range of the oscillator, the injection locking technique provides amplification without any known degradation to the signal under test. The injection locking feature does not change the basic operation of the analyzer; it does provide more input signal power for analyzer operation, which in essence provides more dynamic range in measurement capability.

In the alternative embodiment as shown in FIG. 5 the signal channel power is applied from power divider 12 through threshold attenuator 34 and amplifier 38 to hybrid 20. Attenuator 34 is no longer coupled to the output of divider 32 and this divider output is directly coupled to phase detector 18. Threshold test attenuator 34 is always set for minimum attenuation except during measurement of analyzer internal noise levels as previously noted. Amplifier 38 increases the signal power level entering hybrid 20, providing more dynamic range for a near carrier measurement. Location of the threshold test attenuator and amplifier at the input of the signal channel has two distinct advantages. AM noise components on the amplifier will be cancelled by the discriminator at the same time the carrier is being nulled. This nulling of the carrier allows also an increase of significant level and allowable power output from the amplifier which extends the dynamic measurement range. Since the amplifier is in the signal channel and the signal channel is adjusted to be in quadrature with the reference channel, most of the FM noise generated by this amplifier 38 will appear as an output. This is an advantage because the added FM noise will also be present in the threshold measurement allowing the corrected data to effectively remove the amplifier's additive FM noise.

In the fundamental embodiment of FIG. 1 where sufficient power is available to satisfy the reference channel requirements at balanced phase detector 18, but more dynamic range is required to extract the signal from the threshold noise, an amplifier 42 can be added as shown in FIG. 6. Amplifier 42 is inserted between the output of threshold attenuator 34 and the input of phase detector 18 to increase the dynamics of the measurement with a minimum of degradation to the signal noise levels. This noise level is relatively small when considered with the overall analyzer noise level and the analyzer internal noise threshold is only altered by a relatively small magnitude as compared with the increased dynamic range acquired.

For extremely low level signal inputs to the embodiment of FIG. 1 sufficient power to operate the balanced phase detector may be unavailable. Under this condition, a measurement cannot be accomplished until a sufficient amount of power becomes available in the reference channel. Since insufficient signal level in the reference channel also indicates potential reduction in the signal channel, amplification is necessary in both channels if useable results are to be expected. As shown in FIG. 7, amplifers 48 and 50 are coupled respectively to the reference channel input and to the signal channel input of detector 18. These amplifiers are coupled in series in their respective channels and share a common power supply 52. The common power supply 52 ensures that noise generated by the power supply is coupled to both signal and reference channels and is thereby cancelled in the phase detector. Potential problems of an internal additive noise nature are either minimized or completely avoided by using a pair of amplifiers with matched phase pushing characteristics operating from the power supply common to both amplifiers. Use of an amplifier in the reference channel also allows the coupling factor of power divider 12 between the reference channel and the input signal to be adjusted in a manner which places most of the available signal power in the signal channel providing additional dynamic measurement range in the signal channel. This provides a good tradeoff between available input power and dynamic range in measurement.

A related discriminator device is disclosed in a co-pending application Ser. No. 652,593 entitled "Optimum Threshold Transmission Line Discriminator" by J. R. Ashley, T. A. Barley, and G. J. Rast, Jr.; and in a co-pending application Ser. NO. 652,445 entitled "Optimum Length Transmission Line Discriminator with Low Noise Detector" by T. A. Barley, G. J. Rast, Jr., and J. R. Ashley. These co-pending applications were filed Jan. 26, 1976 simultaneously with applicants' application and assigned to the U.S. Government as represented by the Department of Army.

Several alternative embodiments have been given to the preferred embodiment of FIG. 1. Obviously modification and variations of the present invention are even further possible in light of the above disclosure and will become apparent to those knowledgeable in the art. It is, therefore, to be understood that within the scope of the appended claims, the invention may be practiced otherwise than as specifically disclosed herein.

We claim:
1. A wide operating frequency range transmission line discriminator for measuring input frequency modulation noise signals comprising:
   a bandpass filter having an input and an output, the input being disposed to receive said modulation noise signals;
   first and second power divider means, each having an input and first and second outputs, the input of said first power divider being coupled to the output of said filter to receive said modulation noise signals;
   hybird means having an input coupled to the first output of said first divider and having first, second, and third ports;
   a variable attenuator and transmission line short circuit coupled in series to said first hybrid port for attenuating signals coupled thereto and directing said signals back to said hybrid;
   an optimum length transmission line and a transmission line short circuit coupled in series, with said optimum length line being coupled to said second port of said hybrid;
   said third hybrid port being coupled to the input of said second power divider;
   quadrature detection means having first and second inputs and an output, said first input being coupled to the first output of said second power divider and said input being coupled to the second output of said first power divider, the output of said detection means being disposed for coupling output measurement signals therefrom; and
   a spectrum analyzer coupled to the second output of said second power divider.

2. A wide operating frequency range transmission line discriminator as set forth in claim 1 wherein said optimum length transmission line is a coaxial transmission line having a precise length which provides one-half neper of attenuation across the electrical length of the line for a predetermined frequency.

3. A wide operating frequency range transmission line discriminator as set forth in claim 2 and further comprising a variable length transmission line coupled between said optimum length line and said transmission line short circuit for phase shifting signals coupled therethrough; a signal level attenuator and a phase shifter connected in series between the second output of said first divider and the second input of said quadrature detection means; and a threshold attenuator coupled between the first output of said first divider and the first input of said quadrature detection means.

4. A wide operating frequency range transmission line discriminator as set forth in claim 2 and further comprising a variable length transmission line coupled between said variable attenuator and said short circuit for providing signal phase shifting; a signal level attenuator and an adjustable phase shifter connected in series between the second output of said first divider and the second input of said quadrature detection means; and a threshold attenuator coupled between the first output of said first divider and the first input of said quadrature detection means.

5. A wide operating frequency range transmission line discriminator as set forth in claim 2 and further comprising a series connected threshold attenuator and amplifier coupled between the first output of said first power divider and the input of said hybrid, said amplifier output being coupled to the hybrid; and a signal level attenuator and a phase shifter connected in series between the second output of said first divider and the second input of said quadrature detection means.

6. A wide operating frequency range transmission line discriminator as set forth in claim 3 and further comprising an amplifier connected between the output of said filter and the input of said first power divider.

7. A wide operating frequency range transmission line discriminator as set forth in claim 3 and further comprising a circulator coupled between the output of said filter and the input of said first power divider; and an oscillator coupled to said circulator for injection locking said input noise signals.

8. A wide operating frequency range transmission line discriminator as set forth in claim 3 and further comprising a signal amplifier coupled between the output of said threshold attenuator and the first input of said phase detector.

9. A wide operating frequency range transmission line discriminator as set forth in claim 8 and further comprising a reference amplifier coupled between the output of said phase shifter and the second input of said phase detector; and a power supply common to said reference and signal amplifiers.

* * * * *